(12) United States Patent
Katsuki et al.

(10) Patent No.: US 8,477,823 B2
(45) Date of Patent: Jul. 2, 2013

(54) SEMICONDUCTOR LASER APPARATUS AND OPTICAL APPARATUS

(75) Inventors: Yousuke Katsuki, Oura-gun (JP); Yasuyuki Bessho, Uji (JP)

(73) Assignees: Sanyo Electric Co., Ltd., Moriguchi-Shi, Osaka (JP); Sanyo Optec Design Co., Ltd., Tokyo (JP)

( * ) Notice: Subject to any disclaimer, the term of this patent is extended or adjusted under 35 U.S.C. 154(b) by 84 days.

(21) Appl. No.: 13/284,420

(22) Filed: Oct. 28, 2011

(65) Prior Publication Data

US 2012/0106584 A1 May 3, 2012

(30) Foreign Application Priority Data

Oct. 28, 2010 (JP) .................................. 2010-242440

(51) Int. Cl.
*H01S 3/13* (2006.01)
*H01S 5/00* (2006.01)
*H01S 3/097* (2011.01)

(52) U.S. Cl.
USPC ................ 372/50.21; 372/29.013; 372/50.12; 372/87

(58) Field of Classification Search
USPC ......................... 372/29.013, 50.12, 50.21, 87
See application file for complete search history.

(56) References Cited

U.S. PATENT DOCUMENTS 7,113,528 B2  9/2006 Miyabe et al.

FOREIGN PATENT DOCUMENTS

JP  2004-055744  2/2004

*Primary Examiner* — Armando Rodriguez
(74) *Attorney, Agent, or Firm* — Ditthavong Mori & Steiner, P.C.

(57) ABSTRACT

This semiconductor laser apparatus includes a base, a plurality of electrodes arranged along a first direction on an upper surface of the base, a plurality of semiconductor laser devices bonded to respective upper surfaces of the plurality of electrodes, emitting laser beams in a second direction, and a photodetector having a photosensitive surface arranged in a region of the base in a third direction relative to the plurality of semiconductor laser devices. An electrode arranged in a position other than end portions in the first direction and a fourth direction, of the plurality of electrodes has an extraction wiring portion arranged on the photosensitive surface of the photodetector.

20 Claims, 6 Drawing Sheets

SEMICONDUCTOR LASER APPARATUS AND OPTICAL APPARATUS

CROSS-REFERENCE TO RELATED APPLICATIONS

The priority application number JP2010-242440, Semiconductor Laser Apparatus and Optical Apparatus, Oct. 28, 2010, Yousuke Katsuki et al., upon which this patent application is based, is hereby incorporated by reference.

BACKGROUND OF THE INVENTION

1. Field of the Invention

The present invention relates to a semiconductor laser apparatus and an optical apparatus, and more particularly, it relates to a semiconductor laser apparatus and an optical apparatus each including a base to which a plurality of semiconductor laser devices are bonded through electrodes and a photodetector.

2. Description of the Background Art

A semiconductor laser apparatus including a base to which a plurality of semiconductor laser devices are bonded through electrodes and a photodetector is known in general, as disclosed in Japanese Patent Laying-Open No. 2004-55744, for example.

Japanese Patent Laying-Open No. 2004-55744 discloses a semiconductor laser apparatus including a base, a plurality of semiconductor laser devices aligned in a prescribed direction (transverse direction) on the upper surface of the base, and a photodetector arranged behind the semiconductor laser devices and monitoring intensity of laser beams. In this semiconductor laser apparatus, a plurality of electrodes are aligned in the transverse direction on the upper surface of the base, and each of the semiconductor laser devices is bonded to the upper surface of each of the electrodes. Each of the electrodes is provided with a wire-bonding portion in a region other than a region to which each of the semiconductor laser devices is bonded. In the electrode connected with the inner semiconductor laser device other than the semiconductor laser devices provided on end portions (both end portions) in the transverse direction, of the plurality of semiconductor laser devices, the wire-bonding portion protrudes in the transverse direction to a region between the adjacent semiconductor laser devices.

However, in the semiconductor laser apparatus disclosed in Japanese Patent Laying-Open No. 2004-55744, the electrode connected with the inner semiconductor laser device other than the semiconductor laser devices provided on the end portions (both end portions) in the transverse direction is provided with the wire-bonding portion protruding to the region between the adjacent semiconductor laser devices, and hence a distance from one outer electrode to the other outer electrode is increased by the width of the wire-bonding portion. Therefore, the size of the semiconductor laser apparatus is disadvantageously increased due to an increase in the width of the base if electrodes each having this wire-bonding portion are repeatedly aligned in the transverse direction.

SUMMARY OF THE INVENTION

A semiconductor laser apparatus according to a first aspect of the present invention includes a base, a plurality of electrodes arranged along a first direction on an upper surface of the base, a plurality of semiconductor laser devices bonded to respective upper surfaces of the plurality of electrodes, emitting laser beams in a second direction intersecting with the first direction, and a photodetector having a photosensitive surface arranged in a region of the base in a third direction opposite to the second direction relative to the plurality of semiconductor laser devices, wherein an electrode arranged in a position other than end portions in the first direction and a fourth direction opposite to the first direction, of the plurality of electrodes includes an extraction wiring portion arranged on the photosensitive surface of the photodetector.

An optical apparatus according to a second aspect of the present invention includes a semiconductor laser apparatus including a base, a plurality of electrodes arranged along a first direction on an upper surface of the base, a plurality of semiconductor laser devices bonded to respective upper surfaces of the plurality of electrodes, emitting laser beams in a second direction intersecting with the first direction, and a photodetector having a photosensitive surface arranged in a region of the base in a third direction opposite to the second direction relative to the plurality of semiconductor laser devices, and an optical system controlling laser beams emitted from the semiconductor laser apparatus, wherein an electrode arranged in a position other than end portions in the first direction and a fourth direction opposite to the first direction, of the plurality of electrodes has an extraction wiring portion arranged on the photosensitive surface of the photodetector.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described with reference to the drawings.

First Embodiment

The structure of a three-wavelength semiconductor laser apparatus 100 according to a first embodiment of the present invention is now described with reference to FIGS. 1 to 3. The three-wavelength semiconductor laser apparatus 100 is an example of the "semiconductor laser apparatus" in the present invention.

Figure 1:
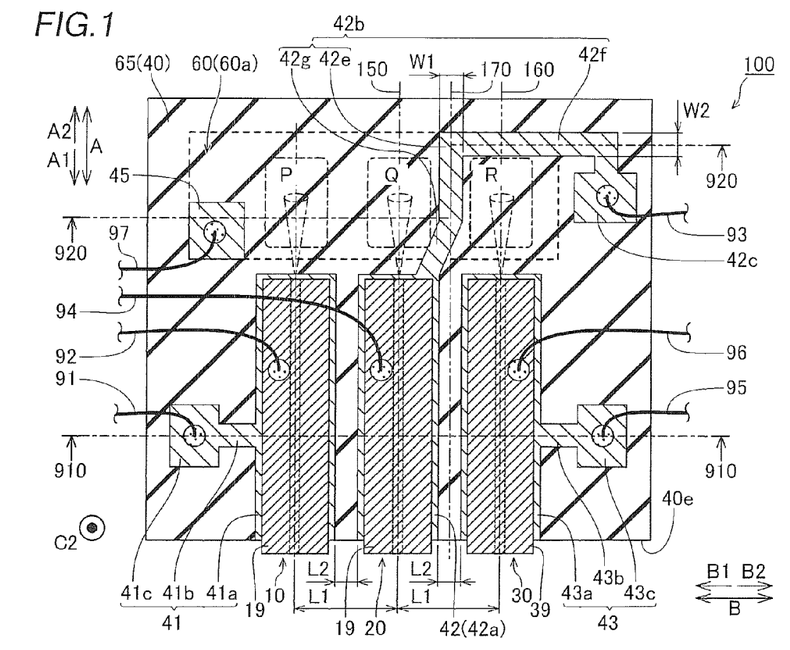
FIG. 1 is a top plan view of a three-wavelength semiconductor laser apparatus according to a first embodiment of the present invention.
Figure 3:
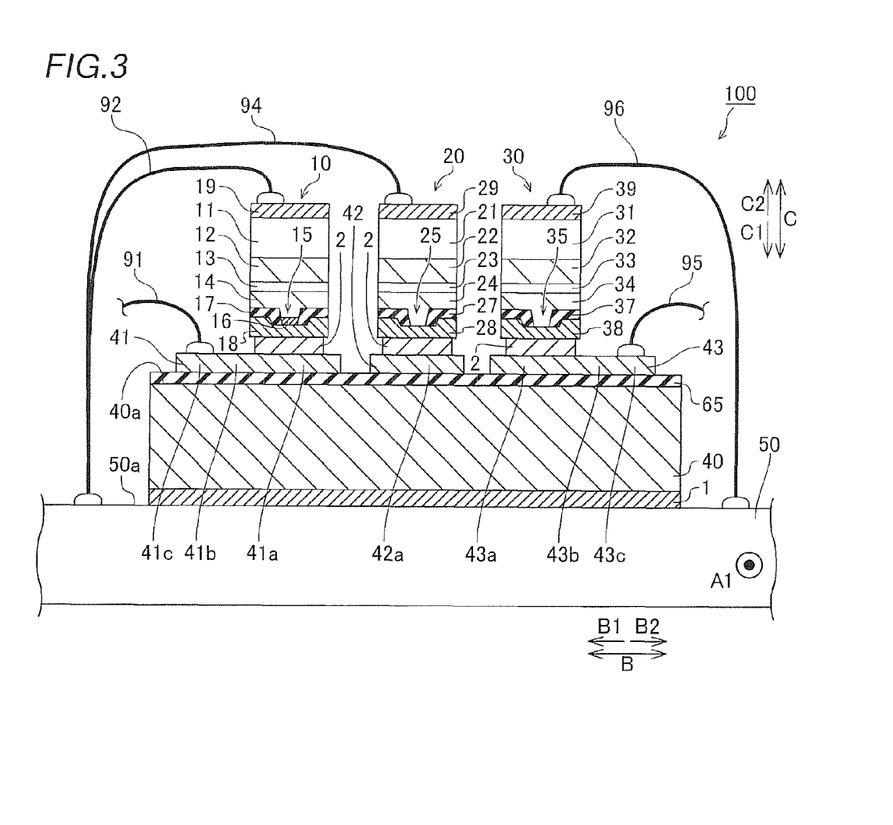
FIG. 3 is a sectional view taken along the line 910-910 in FIG. 1.

In the three-wavelength semiconductor laser apparatus 100 according to the first embodiment of the present invention, a blue-violet semiconductor laser device 10 having a lasing wavelength of about 405 nm, a red semiconductor laser device 20 having a lasing wavelength of about 650 nm, and an infrared semiconductor laser device 30 having a lasing wavelength of about 780 nm are fixed onto the upper surface 40a (on the C2 side) of a tabular heat radiation substrate 40 of n-type Si, as shown in FIGS. 1 and 3. The lower surface (on the C1 side) of the heat radiation substrate 40 is bonded to the upper surface 50a of a base portion 50 through a conductive fusion layer 1 of AuSn solder or the like, as shown in FIG. 3. The heat radiation substrate 40 is an example of the "base" in the present invention. The red semiconductor laser device 20 is an example of the "semiconductor laser device" and the "first semiconductor laser device" in the present invention, the blue-violet semiconductor laser device 10 is an example of the "semiconductor laser device" and the "third semiconductor laser device" in the present invention, and the infrared semiconductor laser device 30 is an example of the "semiconductor laser device" and the "second semiconductor laser device" in the present invention.

The blue-violet semiconductor laser device 10, the red semiconductor laser device 20, and the infrared semiconductor laser device 30 are adjacent to each other in the width direction (direction B) to have an interval L1 (a distance between respective centerlines of the devices extending in a direction A). The blue-violet semiconductor laser device 10, the red semiconductor laser device 20, and the infrared semiconductor laser device 30 are aligned in a direction B2 from one side (B1 side) in the width direction of the heat radiation substrate 40 to the other (B2 side). The direction B2 is an example of the "first direction" in the present invention.

In a pair of cavity facets formed on each of the blue-violet semiconductor laser device 10, the red semiconductor laser device 20, and the infrared semiconductor laser device 30, that emitting a laser beam having relatively large light intensity serves as a light-emitting surface and that having relatively small light intensity serves as a light-reflecting surface. Therefore, the semiconductor laser devices emit the laser beams in a direction A1 in FIG. 1. The direction A1 and the direction B intersect with each other. The light-emitting surfaces of the semiconductor laser devices are aligned on the same plane in positions separated frontward (to the A1 side) from the front surface 40e (see FIG. 1) of the heat radiation substrate 40 with a prescribed distance. A dielectric multilayer film (not shown) made of AlN films, $Al_2O_3$ films, or the like is formed on the light-emitting surface and the light-reflecting surface of each of the semiconductor laser devices by facet coating treatment in a manufacturing process. The direction A1 is an example of the "second direction" in the present invention.

Figure 4:
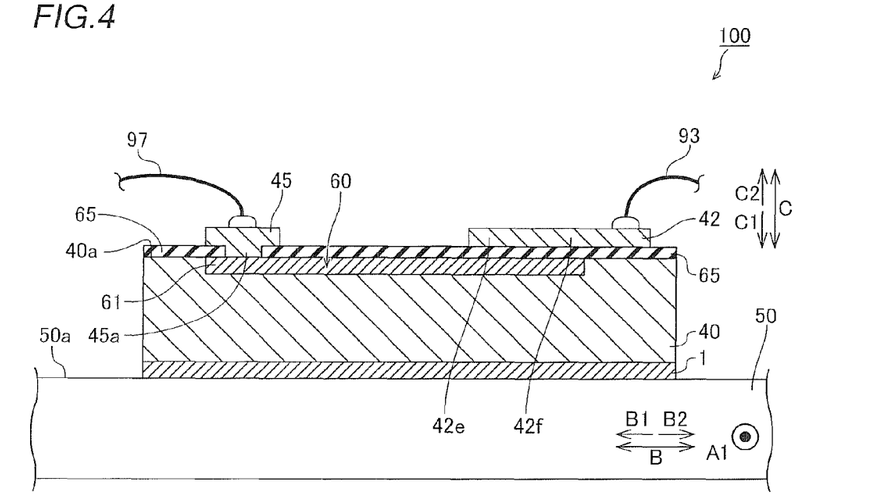
FIG. 4 is a sectional view taken along the line 920-920 in FIG. 1.

As shown in FIG. 1, a photodiode (PD) 60 employed to monitor intensity of laser beams is arranged on the rear sides (in a direction A2) of the light-reflecting surfaces of the blue-violet semiconductor laser device 10, the red semiconductor laser device 20, and the infrared semiconductor laser device 30 on the upper surface 40a of the heat radiation substrate 40. The PD 60 is formed in a state embedded in the heat radiation substrate 40, and the upper surface 40a and a photosensitive surface 60a, which serves as a p-type diffusion region 61 (see FIG. 4) of the PD 60, are flush with each other. Positions of the photosensitive surface 60a corresponding to the respective rear sides of the blue-violet semiconductor laser device 10, the red semiconductor laser device 20, and the infrared semiconductor laser device 30 are photosensitive regions P, Q, and R (shown by alternate long and short dash lines) for the laser beams. The width of the PD 60 in the direction B is wider than the width in the direction B of a region of the upper surface 40a on which pad electrodes 41 to 43 described later are arranged (the length from a B1-side end portion of a device bonding portion 41a of the pad electrode 41 to a B2-side end portion of a device bonding portion 43a of the pad electrode 43). The PD 60 is commonly employed for the blue-violet semiconductor laser device 10, the red semiconductor laser device 20, and the infrared semiconductor laser device 30. The upper surface 40a and the photosensitive surface 60a are covered with a translucent insulating film 65 of $SiO_2$. Therefore, in FIG. 1, the outer shape of the PD 60 embedded on the rear side of the plane of the figure in the insulating film 65 is shown by a broken line. The PD 60 is an example of the "photodetector" in the present invention. The direction A2 is an example of the "third direction" in the present invention.

The pad electrodes 41, 42, and 43 each made of a metal material such as Au are provided in a state insulated from the heat radiation substrate 40 on positions of the insulating film 65 to which the blue-violet semiconductor laser device 10, the red semiconductor laser device 20, and the infrared semiconductor laser device 30 are bonded. The pad electrodes 41, 42, and 43 are arranged at prescribed intervals along the direction B2 in plan view to be insulated from each other. The pad electrodes 41 to 43 are examples of the "plurality of electrodes" in the present invention. The central pad electrode 42 is an example of the "electrode arranged in a position other than the end portion" in the present invention.

Figure 2:
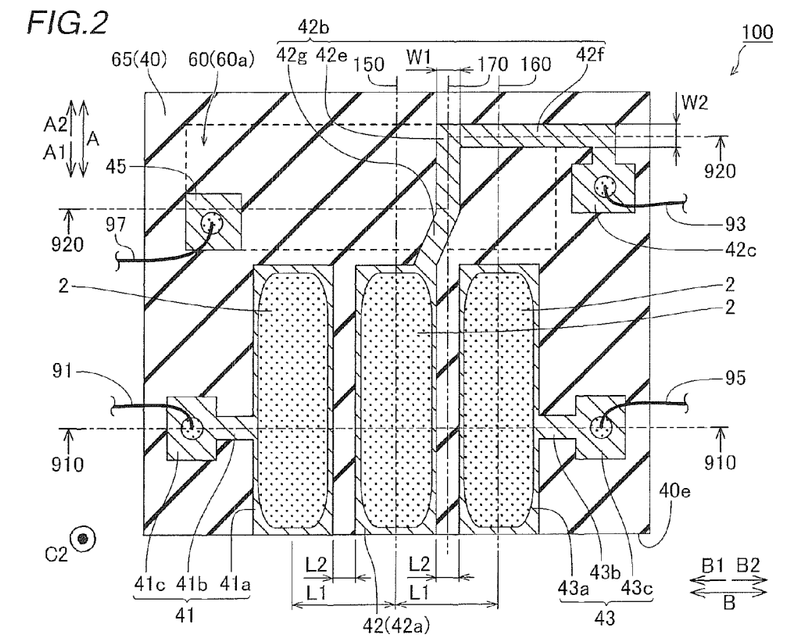
FIG. 2 is a top plan view of the three-wavelength semiconductor laser apparatus according to the first embodiment of the present invention in a state where semiconductor laser devices are removed from a heat radiation substrate.

Specifically, the pad electrode 41 has the device bonding portion 41a formed in a substantially rectangular shape, an extraction wiring portion 41b protruding to the side (B1 side) of the blue-violet semiconductor laser device 10 (see FIG. 1), and a wire-bonding portion 41c connected to the extraction wiring portion 41b, as shown in FIG. 2. The pad electrode 43 has the device bonding portion 43a formed in a substantially rectangular shape, an extraction wiring portion 43b protruding to the side (B2 side) of the infrared semiconductor laser device 30 (see FIG. 1), and a wire-bonding portion 43c connected to the extraction wiring portion 43b. The pad electrodes 41 and 43 are substantially parallelly provided at a prescribed interval in the width direction (direction B), and a device bonding portion 42a of the pad electrode 42, having a substantially rectangular shape is arranged between the pad electrodes 41 and 43. Therefore, the device bonding portions 41a, 42a, and 43a are arranged at intervals L2 in the direction B2. Each of the intervals L2 is set in the range of at least about 40 μm and not more than about 50 μm. The wire-bonding portions 41c and 43c are examples of the "third wire-bonding portion" and the "second wire-bonding portion" in the present invention, respectively.

According to the first embodiment, the pad electrode 42 has the device bonding portion 42a, an extraction wiring portion 42b having a first end connected to an A2-side end portion of the device bonding portion 42a and including a part arranged on the photosensitive surface 60a of the PD 60, and a wire-bonding portion 42c connected to a second end of the extraction wiring portion 42b and arranged on a region outward beyond the PD 60 in the direction B2. The extraction wiring portion 42b is formed on the insulating film 65 formed on the photosensitive surface 60a of the PD 60. Thus, the p-type diffusion region 61 and the pad electrode 42 are insulated from each other. In plan view, the wire-bonding portions 41c to 43c are provided on the sides (B2 and B1 sides) of a region of the heat radiation substrate 40 on which the PD 60 is formed and regions of the heat radiation substrate 40 to which the infrared semiconductor laser device 30 and the blue-violet semiconductor laser device 10 are bonded. The extraction wiring portion 42b is an example of the "extraction wiring portion" in the present invention. The wire-bonding portion 42c is an example of the "first wire-bonding portion" in the present invention.

According to the first embodiment, the extraction wiring portion 42b has a first portion 42e with a width W1 extending in the direction A2 from the device bonding portion 42a and a second portion 42f with a width W2 extending in the direction B2 from an A2-side end portion of the first portion 42e.

The first portion 42e extends in the direction A2 on the photosensitive surface 60a, starting from a position deviating to the infrared semiconductor laser device 30 on the B2 side from a centerline 150 of the red semiconductor laser device 20, of the A2-side end portion of the device bonding portion 42a. The first portion 42e has a bending portion 42g extending obliquely in the direction B2 from the centerline 150 as the same extends in the direction A2 from a portion connected with the device bonding portion 42a. In other words, the bending portion 42g connects a corner of the device bonding portion 42a and a portion of the first portion 42e extending in the direction A2. The first portion 42e extends in the direction A2 along an intermediate line 170 extending along an intermediate position between the centerline 150 and a centerline 160 of the infrared semiconductor laser device 30 from a position of the bending portion 42g reaching the intermediate line 170 up to an A2-side edge portion of the photosensitive surface 60a. The centerlines 150 and 160 are examples of the "first centerline" and the "second centerline" in the present invention, respectively.

The second portion 42f extends on the photosensitive surface 60a along the same direction as the direction B2 in which the first portion 42e is arranged relative to the centerline 150, of a transverse direction (direction B). The second portion 42f is arranged along the vicinity of the A2-side edge portion of the photosensitive surface 60a. The second portion 42f slightly extends in the direction A1 in a region outside the PD 60, and thereafter is connected to the wire-bonding portion 42c. The width W1 of the first portion 42e and the width W2 of the second portion 42f are substantially equal to each other. In this case, the widths W1 and W2 are preferably set in the range of at least about 20 μm and not more than about 30 μm. It is not preferred that the width W1 (W2) is more than 30 μm since the area of the photosensitive surface 60a blocked by the extraction wiring portion 42b is increased. It is not preferred that the width W1 (W2) is less than 20 μm since the extraction wiring portion 42b is easily separated due to an insufficient contact area with the insulating film 65.

According to the first embodiment, the extraction wiring portion 42b is formed to be extracted to the outside of the PD 60 without blocking the photosensitive regions Q and R of the PD 60, as shown in FIG. 1.

A pad electrode 45 serving as a wire-bonding portion for a wire for feeding to the PD 60 is provided on the insulating film 65 in a region corresponding to a corner of the PD 60 on the A1 and B1 sides. Specifically, the pad electrode 45 is formed in the vicinity of a corner of the photosensitive surface 60a of the PD 60 on the B1 side opposite to the B2 side on which the extraction wiring portion 42b is arranged. The pad electrode 45 has a conducting portion 45a passing through the insulating film 65 in the thickness direction (direction c) in a state surrounded by the insulating film 65. The conducting portion 45a is made of a metal material such as Al, and the pad electrode 45 conducts with the p-type diffusion region 61 through the conducting portion 45a on the heat radiation substrate 40. The direction B1 is an example of the "fourth direction" in the present invention.

The blue-violet semiconductor laser device 10 is formed with an n-type cladding layer 12 made of n-type AlGaN on the lower surface of an n-type GaN substrate 11, as shown in FIG. 3. An active layer 13 having a multiple quantum well (MQW) structure formed by alternately stacking quantum well layers (not shown) made of InGaN and barrier layers (not shown) made of GaN is formed on the lower surface of the n-type cladding layer 12. A p-type cladding layer 14 made of p-type AlGaN is formed on the lower surface of the active layer 13.

A ridge portion (projecting portion) 15 extending in a striped (slender) manner along the direction A is formed in the p-type cladding layer 14 in a substantially central portion in the width direction (direction B). Thus, a light-emitting point of the blue-violet semiconductor laser device 10 is formed in a portion of the active layer 13 located above (on the C2 side of) the ridge portion 15. A p-side ohmic electrode 16 formed by stacking a Pt layer, a Pd layer, and an Au layer successively from the side closer to the p-type cladding layer 14 is formed on the lower surface of the ridge portion 15 of the p-type cladding layer 14. A current blocking layer 17 made of SiO$_2$ is formed on the lower surface of the p-type cladding layer 14 other than the ridge portion 15 and the both side surfaces of the ridge portion 15. A p-side electrode 18 is formed on the lower surfaces of the p-side ohmic electrode 16 and the current blocking layer 17. An n-side electrode 19 is formed on a substantially entire region of the upper surface of the n-type GaN substrate 11.

The red semiconductor laser device 20 is formed with an n-type cladding layer 22 made of AlGaInP on the lower surface of an n-type GaAs substrate 21. An active layer 23 having an MQW structure formed by alternately stacking quantum well layers (not shown) made of GaInP and barrier layers (not shown) made of AlGaInP is formed on the lower surface of the n-type cladding layer 22. A p-type cladding layer 24 made of AlGaInP is formed on the lower surface of the active layer 23.

A ridge portion 25 extending in a striped manner along the direction A is formed in the p-type cladding layer 24 in a substantially central portion in the direction B. Thus, a light-emitting point of the red semiconductor laser device 20 is formed in a portion of the active layer 23 located above the ridge portion 25. A current blocking layer 27 made of SiO$_2$ is formed on the lower surface of the p-type cladding layer 24 other than the ridge portion 25 and the both side surfaces of the ridge portion 25. A p-side electrode 28 is formed on the lower surfaces of the ridge portion 25 and the current blocking layer 27. An n-side electrode 29 is formed on a substantially entire region of the upper surface of the n-type GaAs substrate 21.

The infrared semiconductor laser device 30 is formed with an n-type cladding layer 32 made of AlGaAs on the lower surface of an n-type GaAs substrate 31. An active layer 33 having an MQW structure formed by alternately stacking quantum well layers made of AlGaAs having a lower Al composition and barrier layers made of AlGaAs having a higher Al composition is formed on the lower surface of the n-type cladding layer 32. A p-type cladding layer 34 made of AlGaAs is formed on the lower surface of the active layer 33.

A ridge portion 35 extending in a striped manner along the direction A is formed in the p-type cladding layer 34 in a substantially central portion in the direction B. Thus, a light-emitting point of the infrared semiconductor laser device 30 is formed in a portion of the active layer 33 located above the ridge portion 35. A current blocking layer 37 made of $SiO_2$ is formed on the lower surface of the p-type cladding layer 34 other than the ridge portion 35 and the both side surfaces of the ridge portion 35. A p-side electrode 38 is formed on the lower surfaces of the ridge portion 35 and the current blocking layer 37. An n-side electrode 39 is formed on a substantially entire region of the upper surface of the n-type GaAs substrate 31.

The blue-violet semiconductor laser device 10, the red semiconductor laser device 20, and the infrared semiconductor laser device 30 are mounted on the heat radiation substrate 40 in a junction-down system such that the respective light-emitting surfaces are directed toward the front surface 40e. In other words, the p-side electrode 18 of the blue-violet semiconductor laser device 10 and the pad electrode 41 are electrically connected with each other through a conductive fusion layer 2 of AuSn solder or the like, and the p-side electrode 28 of the red semiconductor laser device 20 and the pad electrode 42 are electrically connected with each other through a conductive fusion layer 2. The p-side electrode 38 of the infrared semiconductor laser device 30 and the pad electrode 43 are electrically connected with each other through a conductive fusion layer 2.

A first end of a metal wire 91 made of Au or the like is connected to the wire-bonding portion 41c, and a second end thereof is connected to a lead terminal (on an anode side) (not shown). A first end of a metal wire 92 is connected to the n-side electrode 19 formed on the upper surface of the substrate of the blue-violet semiconductor laser device 10, and a second end thereof is connected to the base portion 50 conducting with a cathode terminal (not shown). A first end of a metal wire 93 made of Au or the like is connected to the wire-bonding portion 42c, and a second end thereof is connected to a lead terminal (on the anode side) (not shown). A first end of a metal wire 94 is connected to the n-side electrode 29 formed on the upper surface of the substrate of the red semiconductor laser device 20, and a second end thereof is connected to the base portion 50. A first end of a metal wire 95 made of Au or the like is connected to the wire-bonding portion 43c, and a second end thereof is connected to a lead terminal (on the anode side) (not shown). A first end of a metal wire 96 is connected to the n-side electrode 39 formed on the upper surface of the substrate of the infrared semiconductor laser device 30, and a second end thereof is connected to the base portion 50.

A first end of a metal wire 97 made of Au or the like is connected to the pad electrode 45, and a second end thereof is connected to a lead terminal (on the anode side) (not shown). Thus, current can be individually supplied from the anode lead terminals to the semiconductor laser devices and the PD 60, and the n-side electrodes of the semiconductor laser devices and the PD 60 are connected to a common terminal (cathode terminal).

A manufacturing process for the three-wavelength semiconductor laser apparatus 100 according to the first embodiment is now described with reference to FIGS. 1 to 7.

Figure 5:
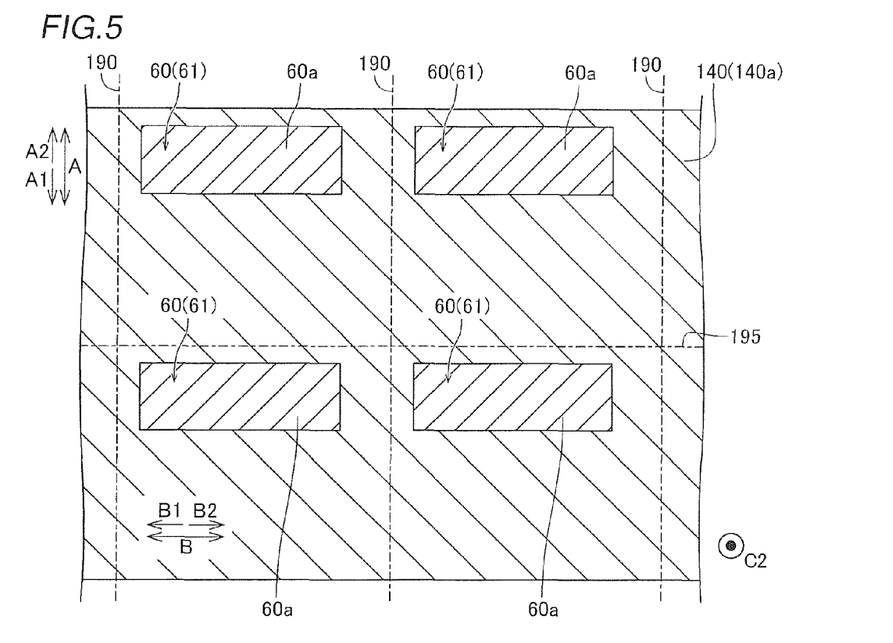
FIGS. 5 to 7 are top plan views for illustrating a manufacturing process for the three-wavelength semiconductor laser apparatus according to the first embodiment of the present invention.

First, the heat radiation substrate 40 (see FIG. 2) in which the PD 60 is embedded is prepared. Specifically, ions are implanted into prescribed regions of the upper surface 140a of a substrate 140 in a wafer state made of n-type Si thereby forming the embedded p-type diffusion regions 61, as shown in FIG. 5. Thus, the PDs 60 in a state where the photosensitive surfaces 60a are flush with the upper surface 140a are formed. FIG. 5 shows a portion of the substrate 140 in a wafer state in which a plurality of (four) the PDs 60 are formed.

Figure 6:
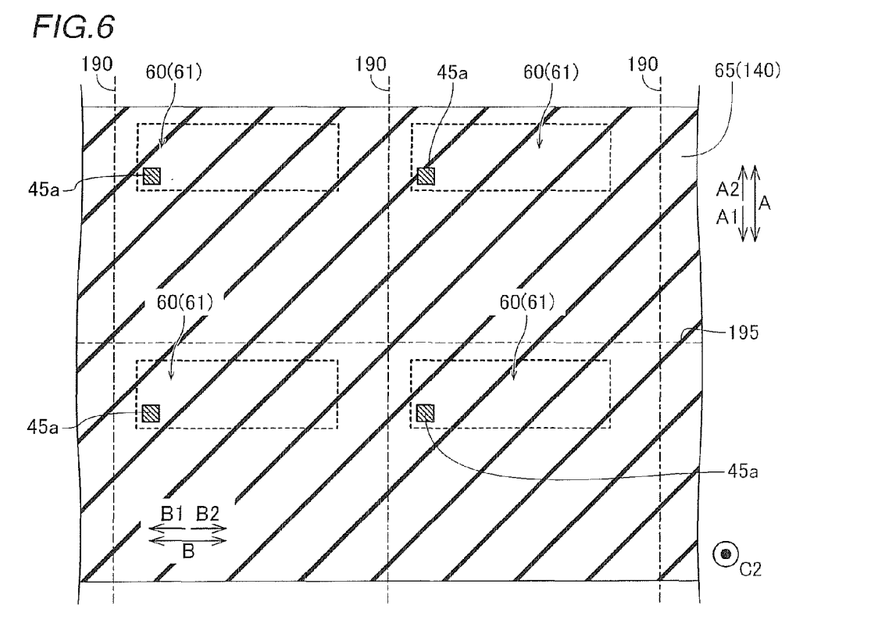

Thereafter, the insulating film 65 made of $SiO_2$ is formed with a prescribed thickness on the upper surface 140a (see FIG. 5) by vacuum evaporation or the like, as shown in FIG. 6. Thus, the entire photosensitive surfaces 60a (see FIG. 5) of the PDs 60 are also covered with the insulating film 65. Then, a hole passing through the insulating film 65 in the thickness direction (direction C) is formed in the vicinity of one corner (on the A1 and B1 sides) of each of the PDs 60 by photolithography and dry etching, and thereafter the conducting portion 45a is formed by embedding a wiring material of Al in this hole by plating or the like.

Figure 7:
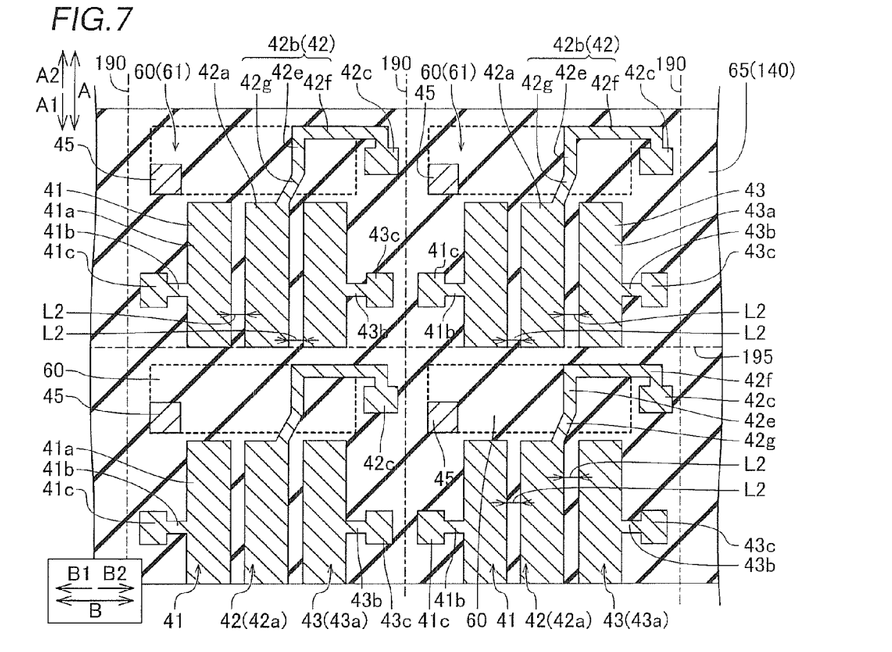

Thereafter, an electrode layer (not shown) made of a metal material is evenly formed on the insulating film 65, and a mask layer (not shown) is formed on this electrode layer. Then, the mask layer is patterned in the form of the pad electrodes 41, 42, 43, and 45 (see FIG. 7) by photolithography, and the patterned mask layer is employed as a mask to remove the electrode layer located below by etching. Thus, the pad electrodes 41, 42, 43, and 45 each are patterned to have a prescribed planar shape on the insulating film 65 other than a region where the excessive electrode layer is removed, as shown in FIG. 7. At this time, the pad electrode 42 having the device bonding portion 42a arranged between the device bonding portions 41a and 43a is formed with the extraction wiring portion 42b extracted to a region outside the PD 60 through the photosensitive surface 60a of the PD 60. Thus, the device bonding portions 41a to 43a of the pad electrodes 41 to 43 are arranged at the minimum intervals L2 in the transverse direction (direction B). The pad electrodes 41, 42, and 43 are formed with the wire-bonding portions 41c, 42c, and 43c through the extraction wiring portions 41b, 42b, and 43b, respectively. A portion of the lower surface of the pad electrode 45 not in contact with the upper surface of the insulating film 65 is connected with the conducting portion 45a (see FIG. 6). Thereafter, the conductive fusion layers 2 (see FIG. 2) in the form of paste are formed on the upper surfaces (on the C2 side) of the device bonding portions 41a, 42a, and 43a.

In this state, the substrate 140 is divided along division lines 190 and 195 intersecting with each other by dicing or the like, whereby the divided heat radiation substrate 40 (see FIG. 2) is formed.

Thereafter, the p-side electrode 18 of the blue-violet semiconductor laser device 10 formed through a prescribed manufacturing process and the pad electrode 41 are bonded to each other through the conductive fusion layer 2, as shown in FIG. 3. Similarly, the p-side electrode 28 of the red semiconductor laser device 20 and the pad electrode 42 are bonded to each other through the conductive fusion layer 2, and the p-side electrode 38 of the infrared semiconductor laser device 30 and the pad electrode 43 are bonded to each other through the conductive fusion layer 2. Thereafter, the upper surface 50a of the base portion 50 and the lower surface of the heat radiation substrate 40 are bonded to each other through the conductive fusion layer 1.

Thereafter, the wire-bonding portion 41c and the lead terminal (not shown) are connected with each other through the metal wire 91, as shown in FIG. 1. The wire-bonding portion 42c and the lead terminal (not shown) are connected with each other through the metal wire 93. The wire-bonding portion 43c and the lead terminal (not shown) are connected with each other through the metal wire 95. The pad electrode 45 and the lead terminal (not shown) are connected with each other through the metal wire 97. The n-side electrode 19 of the blue-violet semiconductor laser device 10 and the base portion 50 (see FIG. 3) are connected with each other through the metal wire 92. The n-side electrode 29 of the red semiconductor laser device 20 and the base portion 50 are connected with each other through the metal wire 94. The n-side electrode 39 of the infrared semiconductor laser device 30 and the base portion 50 are connected with each other through the metal wire 96. Thus, the three-wavelength semiconductor laser apparatus 100 is formed.

According to the first embodiment, as hereinabove described, the pad electrode 42 includes the extraction wiring portion 42b arranged on the photosensitive surface 60a of the PD 60, whereby the inner pad electrode 42 sandwiched between the pad electrodes 41 and 43 can be provided with a wiring portion extracted to the side of the PD 60 through the photosensitive surface 60a of the PD 60 located on the rear side without employing a region (a region having the interval L2 in FIG. 1) between the pad electrode 42 and the pad electrode 41 or 43. Thus, no wiring portion for extraction, wire-bonding portion for wire bonding, or the like may be provided between the pad electrodes adjacent to each other in the direction B, and hence the pad electrodes 41 to 43 can be arranged along the direction B in a state where the intervals L2 are narrower. Consequently, the width of the heat radiation substrate 40 in the direction B can be decreased, and hence the three-wavelength semiconductor laser apparatus 100 mounted with the blue-violet semiconductor laser device 10, the red semiconductor laser device 20, and the infrared semiconductor laser device 30 can be downsized.

According to the first embodiment, the pad electrode 42 includes the extraction wiring portion 42b arranged on the photosensitive surface 60a of the PD 60, whereby the pad electrode 42 can be easily extracted to the side (B2 side) of the PD 60 through the photosensitive surface 60a of the PD 60 located on the rear side without employing the region (the region having the interval L2 in FIG. 1) between the pad electrode 42 and the adjacent pad electrode 41 or 43. An extraction wiring pattern of the pad electrode 42 includes a wiring pattern in which the pad electrode 42 intersects with a region other than the PD 60 such as a region located under or over the adjacent pad electrode 41 or 43. Further, a wiring pattern in which a region secured by partially removing the pad electrode 41 or 43 extending in the direction A is employed to extract the pad electrode 42 to the outside is also available. However, in any of these cases, it is necessary to pass across a region located under the pad electrode 41 or the blue-violet semiconductor laser device 10, or the pad electrode 43 or the infrared semiconductor laser device 30, and hence it is necessary to provide insulating means separately. Thus, the layer structure of a plurality of electrode members patterned on the heat radiation substrate 40 is rendered more complicated. On the other hand, in the three-wavelength semiconductor laser apparatus 100 according to the first embodiment, a region on the photosensitive surface 60a is effectively utilized to provide the extraction wiring portion 42b, and hence planar intersection of the extraction wiring portion 42b with the pad electrode 41 or the blue-violet semiconductor laser device 10, or planar intersection of the extraction wiring portion 42b with the pad electrode 43 or the infrared semiconductor laser device 30 can be avoided. Thus, the pad electrodes 41 to 43 can be easily patterned in the manufacturing process. Further, the wire-bonding portion 42c of the pad electrode 42 can be distanced from the adjacent pad electrodes 41 and 43 and the blue-violet and infrared semiconductor laser devices 10 and 30, and hence the wires can be easily bonded to the wire-bonding portions 41c to 43c also in wire bonding.

According to the first embodiment, the extraction wiring portion 42b is arranged not to block the photosensitive regions P, Q, and R (see FIG. 1) of the photosensitive surface 60a of the PD 60 receiving the laser beams emitted in the direction A2 from the blue-violet semiconductor laser device 10, the red semiconductor laser device 20, and the infrared semiconductor laser device 30. Thus, the pad electrodes 41 to 43 can be arranged along the direction B in a state where the intervals L2 are narrower without losing a monitoring function of the PD 60.

According to the first embodiment, the insulating film 65 is formed of $SiO_2$ on the upper surface 40a of the heat radiation substrate 40, and the extraction wiring portion 42b is formed through the insulating film 65 covering the photosensitive surface 60a of the PD 60. Thus, electrical contact of the p-type diffusion region 61 of the PD 60 with the extraction wiring portion 42b can be easily prevented. Consequently, a power supply route to the red semiconductor laser device 20 and a power supply route to the PD 60 can be reliably separated from each other. Further, the insulating film 65 has translucency, and hence the monitored laser beams can be reliably incident upon the photosensitive regions P, Q, and R even if the entire photosensitive surface 60a is covered with the insulating film 65 insulating the p-type diffusion region 61 from the extraction wiring portion 42b.

According to the first embodiment, the extraction wiring portion 42b has the first portion 42e extending in the direction A2 on the photosensitive surface 60a of the PD 60, starting from the position deviating to the infrared semiconductor laser device 30 adjacent on the B2 side from the centerline 150 of the red semiconductor laser device 20, of the A2-side end portion of the device bonding portion 42a. In this case, the first portion 42e extends from the corner of the device bonding portion 42a on the A2 and B2 sides. Thus, a laser beam-emitting point of an emitting facet of the red semiconductor laser device 20 formed in the vicinity of the centerline 150 and the first portion 42e of the extraction wiring portion 42b can be arranged to overlap with each other in plan view as little as possible. Thus, the first portion 42e can be easily inhibited from blocking the photosensitive region Q (see FIG. 1) of the PD 60 located on the rear side (A2 side) of the laser beam-emitting point.

According to the first embodiment, the first portion 42e has the bending portion 42g extending obliquely in the direction B2 from the centerline 150 as the same extends in the direction A2 at the portion connected with the device bonding portion 42a. In other words, the first portion 42e is provided with the bending portion 42g extending obliquely from the device bonding portion 42a, and hence the first portion 42e protruding from the device bonding portion 42a and the adjacent device bonding portion 43a can be separated from each other in the direction B, as compared with a case where the first portion 42e is formed to extend in the direction A2 on the intermediate line 170 after the same extends transversely in the direction B2 from the device bonding portion 42a to reach the intermediate line 170. Thus, the conductive fusion layer 2 (see FIG. 2) applied onto the device bonding portion 42a can be easily inhibited from protruding from the first portion 42e and flowing out to the device bonding portion 43a, even if the same is melted in bonding the semiconductor laser device. Consequently, short circuit between the pad electrodes in bonding the device can be inhibited as much as possible.

According to the first embodiment, the first portion 42e partially extends in the direction A2 on the intermediate line 170 extending along the intermediate position between the centerline 150 and the centerline 160 of the infrared semiconductor laser device 30 adjacent on the B2 side extending in the direction A. Thus, the first portion 42e can be easily inhibited from blocking not only the photosensitive region Q for the red semiconductor laser device 20 but also the photosensitive region R (see FIG. 1) for the infrared semiconductor laser device 30 adjacent on the B2 side, of the photosensitive surface 60a of the PD 60.

According to the first embodiment, the extraction wiring portion 42b has the second portion 42f extending in the direction B from the A2-side end portion of the first portion 42e, and the second portion 42f extends on the photosensitive surface 60a of the PD 60 along the direction B2 in which the first portion 42e is arranged relative to the centerline 150, of the direction B. Thus, the second portion 42f of the extraction wiring portion 42b can extend in the same direction as the direction B2 in which the first portion 42e deviates from the centerline 150, and hence a loss due to a to-and-fro wiring pattern is inhibited so that the length of the second portion 42f can be rendered shorter, as compared with a case where the same extends in the direction B1 opposite to the direction B2 of the direction B, in which the first portion 42e deviates from the centerline 150. Further, the second portion 42f does not pass across the rear side (A2 side) of the photosensitive region Q for the red semiconductor laser device 20, and hence the photosensitive region Q can be easily prevented from being blocked by the second portion 42f.

According to the first embodiment, the second portion 42f is arranged on the photosensitive surface 60a in the vicinity of an A2-side edge portion of the PD 60. Thus, the second portion 42f can extend in the direction B2 from a position of the photosensitive surface 60a of the PD 60 located on the rear side (A2 side) of the infrared semiconductor laser device 30, which is as far away from the infrared semiconductor laser device 30 in the direction A2 as possible. Thus, the second portion 42f can be prevented from blocking the photosensitive region R located on the front side (A1 side) as much as possible.

According to the first embodiment, the infrared semiconductor laser device 30 arranged in a position opposed to the second portion 42f is bonded in a junction-down system such that the lower surface of the p-side electrode 38 on the side closer to the active layer 33 is opposed to the device bonding portion 43a. Even if the second portion 42f passes across the photosensitive surface 60a on the rear side of the infrared semiconductor laser device 30, the infrared semiconductor laser device 30 is bonded in a junction-down system, and hence the photosensitive region R (see FIG. 1) can be easily secured between the second portion 42f and the infrared semiconductor laser device 30.

According to the first embodiment, the width W1 of the first portion 42e and the width W2 of the second portion 42f are substantially equal to each other. Thus, the strength of the extraction wiring portion 42b is substantially uniform along the extensional direction, and hence the extraction wiring portion 42b can be easily inhibited from separation from the insulating film 65 and disconnection.

According to the first embodiment, the width of the PD 60 in the direction B is wider than the width in the direction B of the region on which the pad electrodes 41 to 43 are arranged, and the PD 60 is commonly employed for the blue-violet semiconductor laser device 10, the red semiconductor laser device 20, and the infrared semiconductor laser device 30. Thus, the extraction wiring portion 42b of the pad electrode 42 can be formed by effectively utilizing the PD 60 having the wide photosensitive surface 60a commonly employed for the semiconductor laser devices 10 to 30, and hence the three-wavelength semiconductor laser apparatus 100 can be effectively downsized.

According to the first embodiment, the PD 60 is embedded in the heat radiation substrate 40 made of n-type Si, and the photosensitive surface 60a is flush with the upper surface 40a of the heat radiation substrate 40, whereby the translucent insulating film 65 can be formed flatly on the upper surface 40a. Thus, the pad electrode 42 having the extraction wiring portion 42b can be easily provided on the heat radiation substrate 40.

According to the first embodiment, the pad electrode 42 has the wire-bonding portion 42c provided to be extracted from the extraction wiring portion 42b (second portion 42f) to the outside of the photosensitive surface 60a of the PD 60 in the direction B2. Thus, the length of the heat radiation substrate 40 in the direction A can be decreased as compared with a case where the wire-bonding portion 42c is arranged on the heat radiation substrate 40 on the A2 side of the PD 60. Further, the wire-bonding portion 42c is arranged on a side region of the heat radiation substrate 40 along the width direction (direction B), and hence the metal wire 93 can be easily bonded without coming close to the PD 60.

According to the first embodiment, the pad electrodes 41 and 43 have the wire-bonding portions 41c and 43c provided to be extracted to the side (B1 side) of the blue-violet semiconductor laser device 10 and the side (B2 side) of the infrared semiconductor laser device 30 opposite to the pad electrode 42, respectively. Thus, in addition to the wire-bonding portion 42c, the wire-bonding portions 41c and 43c are arranged on side regions of the heat radiation substrate 40 along the width direction (direction B), and hence the metal wires 91 and 95 can be easily bonded without coming close to the PD 60 and the semiconductor laser devices.

According to the first embodiment, the three-wavelength semiconductor laser apparatus 100 includes the pad electrode 45 formed on the B1 side opposite to the B2 side of the PD 60 on which the extraction wiring portion 42b is arranged and conducting with the p-type diffusion region 61. Further, the pad electrode 45 is arranged in the vicinity of the corner of the photosensitive surface 60a on the A1 and B1 sides. Thus, the pad electrode 45 can be arranged as far as possible from the extraction wiring portion 42b, and hence the photosensitive region P of the blue-violet semiconductor laser device 10 and the photosensitive region Q of the red semiconductor laser device 20 (see FIG. 1) can be secured in the photosensitive surface 60a without difficulty.

First Modification of First Embodiment

Figure 8:
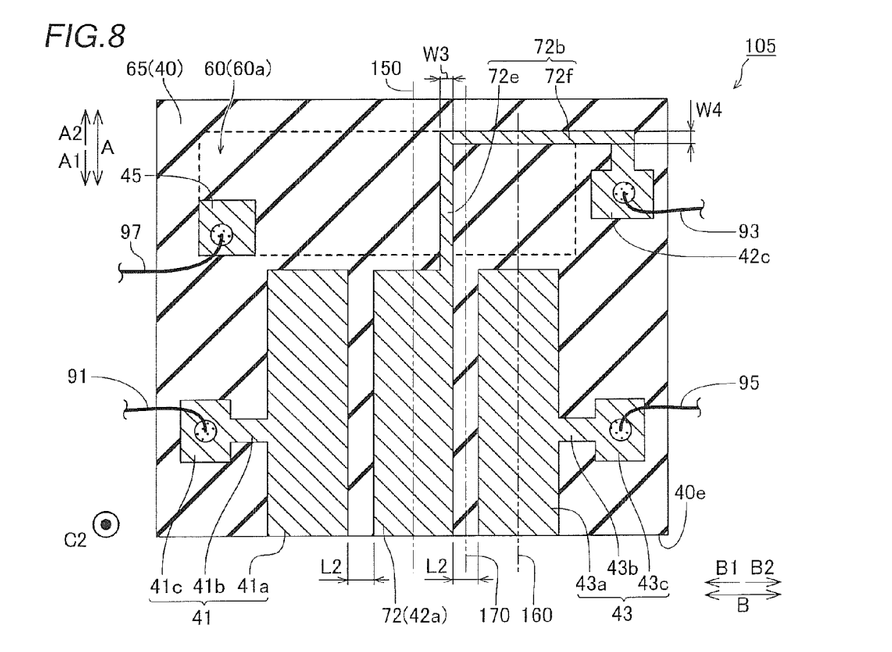
FIG. 8 is a top plan view of a three-wavelength semiconductor laser apparatus according to a first modification of the first embodiment of the present invention in a state where semiconductor laser devices are removed from a heat radiation substrate.

A first modification of the first embodiment is now described. In a three-wavelength semiconductor laser apparatus 105 according to the first modification of the first embodiment, no bending portion 42g of the first embodiment is provided in a first portion 72e of an extraction wiring portion 72b, as shown in FIG. 8. Therefore, the extraction wiring portion 72b of a pad electrode 72 is patterned such that the first portion 72e having a width W3 linearly extends in a direction A2 from a portion connected with a device bonding portion 42a, and thereafter a second portion 72f having a width W4 extends in a direction B2 from an A2-side edge portion of a photosensitive surface 60a. In this case, the first portion 72e is arranged in a region between a centerline 150 and an intermediate line 170. The width W3 of the first portion 72e is preferably smaller than the width W1 (see FIG. 1) of the first portion 42e but is preferably at least about 20 μm. The width W4 of the second portion 72f may be substantially equal to the width W2 (see FIG. 1) of the second portion 42f or substantially equal to the width W3 of the first portion 72e. The pad electrode 72 is an example of the "electrode arranged in a position other than the end portion" in the present invention.

The remaining structure of the three-wavelength semiconductor laser apparatus 105 according to the first modification of the first embodiment is similar to that of the three-wavelength semiconductor laser apparatus 100 according to the first embodiment and denoted by the same reference numerals in the figure.

A manufacturing process for the three-wavelength semiconductor laser apparatus 105 according to the first modification of the first embodiment is substantially similar to the manufacturing process for the three-wavelength semiconductor laser apparatus 100 according to the first embodiment except that the pad electrode 72 is formed without providing the bending portion 42g of the first embodiment.

According to the first modification of the first embodiment, as hereinabove described, the extraction wiring portion 72b is constituted by the first portion 72e linearly extending in the direction A2 and the second portion 72f linearly extending in the direction B2. Further, the first portion 72e is arranged between the centerline 150 and the intermediate line 170. Thus, the extraction wiring portion 72b not blocking photosensitive regions Q and R can be formed with a simpler wiring pattern. The remaining effects of the first modification of the first embodiment are similar to those of the aforementioned first embodiment.

Second Modification of First Embodiment

Figure 9:
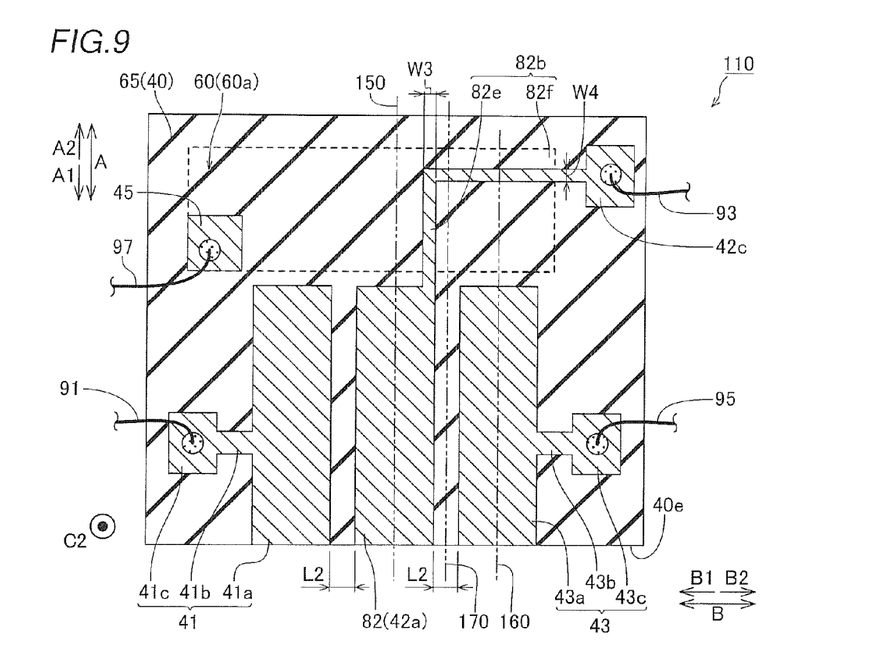
FIG. 9 is a top plan view of a three-wavelength semiconductor laser apparatus according to a second modification of the first embodiment of the present invention in a state where semiconductor laser devices are removed from a heat radiation substrate.

A second modification of the first embodiment is now described. In a three-wavelength semiconductor laser apparatus 110 according to the second modification of the first embodiment, a second portion 82f of an extraction wiring portion 82b is arranged inward beyond (on the A1 side of) an A2-side edge portion of a photosensitive surface 60a, as shown in FIG. 9. Therefore, the extraction wiring portion 82b is constituted by a first portion 82e having a length in a direction A shorter than those of the first portion 42e of the first embodiment and the first portion 72e of the first modification of the first embodiment and the second portion 82f. A position in the direction A where the second portion 82f is arranged is preferably a position where the second portion 82f blocks as little as possible a photosensitive region R receiving a laser beam emitted from a light-reflecting surface of an infrared semiconductor laser device 30. The remaining structure of the three-wavelength semiconductor laser apparatus 110 according to the second modification of the first embodiment is similar to that of the three-wavelength semiconductor laser apparatus 100 according to the first embodiment and denoted by the same reference numerals in the figure.

A manufacturing process for the three-wavelength semiconductor laser apparatus 110 according to the second modification of the first embodiment is substantially similar to the manufacturing process for the three-wavelength semiconductor laser apparatus 105 according to the first modification of the first embodiment except that the first portion 82e is patterned to have the length in the direction A shorter than that of the first portion 72e of the first modification of the first embodiment. The effects of the second modification of the first embodiment are similar to those of the aforementioned first modification of the first embodiment.

Second Embodiment

Figure 10:
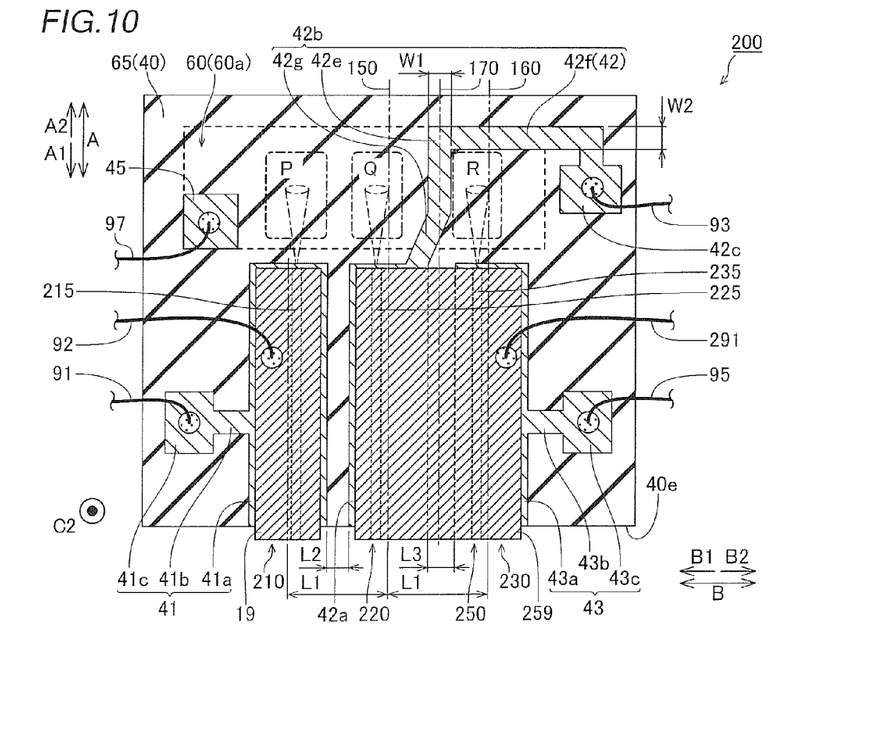
FIG. 10 is a top plan view of a three-wavelength semiconductor laser apparatus according to a second embodiment of the present invention.
Figure 11:
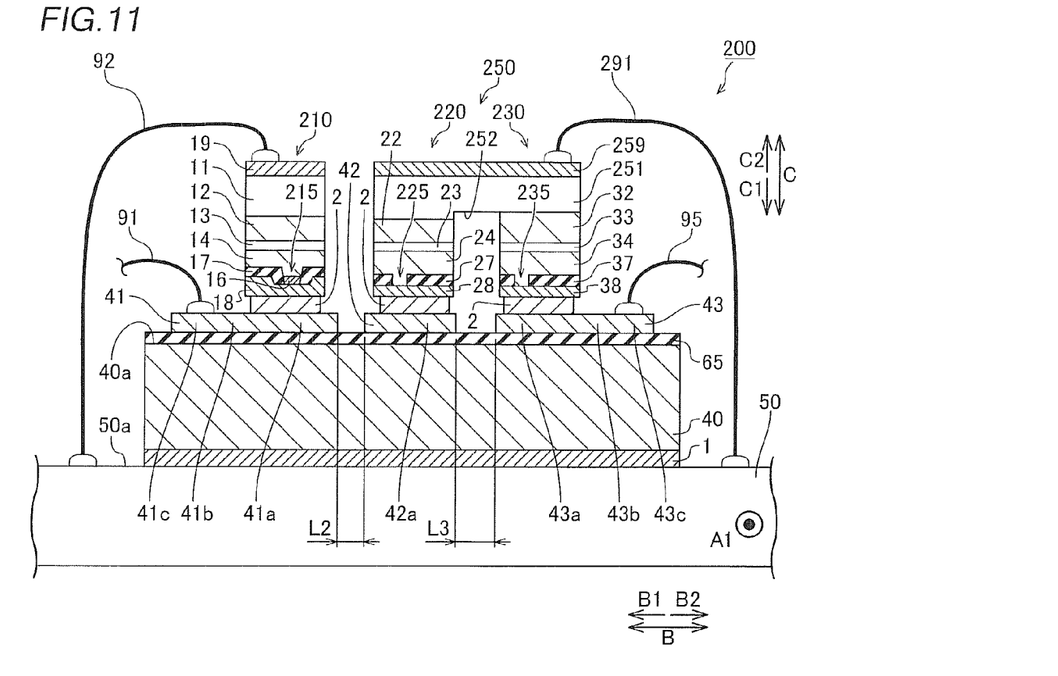
FIG. 11 is a front elevational view of the three-wavelength semiconductor laser apparatus according to the second embodiment of the present invention, as viewed from a laser beam emitting direction.

A second embodiment is now described with reference to FIGS. 10 and 11. In a three-wavelength semiconductor laser apparatus 200 according to the second embodiment, a two-wavelength semiconductor laser device 250 formed of a red semiconductor laser device 220 and an infrared semiconductor laser device 230 is employed in place of the red semiconductor laser device 20 and the infrared semiconductor laser device 30 of the first embodiment. The three-wavelength semiconductor laser apparatus 200 is an example of the "semiconductor laser apparatus" in the present invention. In the figures, a structure similar to that of the three-wavelength semiconductor laser apparatus 100 according to the first embodiment is denoted by the same reference numerals.

First, the structure of the three-wavelength semiconductor laser apparatus 200 according to the second embodiment of the present invention is described with reference to FIGS. 2, 10 and 11.

The three-wavelength semiconductor laser apparatus 200 according to the second embodiment includes a heat radiation substrate 40, a blue-violet semiconductor laser device 210, the two-wavelength semiconductor laser device 250 having the red semiconductor laser device 220 with a lasing wavelength of about 650 nm and the infrared semiconductor laser device 230 with a lasing wavelength of about 780 nm monolithically formed on a common n-type GaAs substrate 251, and a base portion 50. The red semiconductor laser device 220 is an example of the "semiconductor laser device" and the "first semiconductor laser device" in the present invention, the blue-violet semiconductor laser device 210 is an example of the "semiconductor laser device" and the "third semiconductor laser device" in the present invention, and the infrared semiconductor laser device 230 is an example of the "semiconductor laser device" and the "second semiconductor laser device" in the present invention.

The red semiconductor laser device 220 is formed on one side (B1 side) on the lower surface of the n-type GaAs substrate 251, and the infrared semiconductor laser device 230 is formed on the other side (B2 side) on the lower surface of the n-type GaAs substrate 251. The red semiconductor laser device 220 and the infrared semiconductor laser device 230 are arranged at a prescribed interval through a groove portion 252 formed in a substantially central portion in a direction B. The red semiconductor laser device 220 and the infrared semiconductor laser device 230 are formed on the lower surface of the common n-type GaAs substrate 251, and hence side end portions of the red semiconductor laser device 220 and the infrared semiconductor laser device 230 (inner surfaces of the groove portion 252) opposed to each other easily approach each other in the direction B. Therefore, an interval L3 in the direction B between a device bonding portion 42a of a pad electrode 42 to which the red semiconductor laser device 220 is bonded and a device bonding portion 43a of a pad electrode 43 to which the infrared semiconductor laser device 230 is bonded is larger than the aforementioned interval L2 (see FIG. 2) of the first embodiment, as shown in FIG. 11. Thus, short circuit between the device bonding portions 42a and 43a due to conductive fusion layers 2 melted in bonding the device is further inhibited.

The red semiconductor laser device 220 is formed with an n-type cladding layer 22, an active layer 23, a p-type cladding layer 24, a current blocking layer 27, and a p-side electrode 28 on the B1 side on the lower surface of the n-type GaAs substrate 251. A ridge portion 225 is formed in a region deviating to the blue-violet semiconductor laser device 210 (B1 side) from a central portion (centerline 150 in FIG. 10) of the red semiconductor laser device 220 in the width direction. In other words, the ridge portion 225 is arranged on the B1 side opposite to the B2 side on which an extraction wiring portion 42b is arranged relative to the centerline 150.

The infrared semiconductor laser device 230 is formed with an n-type cladding layer 32, an active layer 33, a p-type cladding layer 34, a current blocking layer 37, and a p-side electrode 38 on the B2 side on the lower surface of the n-type GaAs substrate 251. A ridge portion 235 is formed in a region deviating to the blue-violet semiconductor laser device 210 (B1 side) from a central portion (centerline 160 in FIG. 10) of the infrared semiconductor laser device 230 in the width direction. A common n-side electrode 259 is formed on a substantially entire region of the upper surface of the n-type GaAs substrate 251.

The p-side electrodes 28 and 38 are bonded to the upper surface of the heat radiation substrate 40, whereby the two-wavelength semiconductor laser device 250 is bonded in a junction-down system such that the active layers 23 and 33 are closer to the heat radiation substrate 40 (C1 side) than the n-type GaAs substrate 251.

A ridge portion 215 of the blue-violet semiconductor laser device 210 is formed in a region deviating to the two-wavelength semiconductor laser device 250 (B2 side) from a central portion of the blue-violet semiconductor laser device 210 in the width direction (direction B). Thus, light-emitting points of the blue-violet semiconductor laser device 210 and the two-wavelength semiconductor laser device 250 are gathered at a central portion of the three-wavelength semiconductor laser apparatus 200 in the width direction.

A first end of a metal wire 291 is bonded to the n-side electrode 259, and a second end of the metal wire 291 is connected to the base portion 50. The remaining structure of the three-wavelength semiconductor laser apparatus 200 according to the second embodiment is similar to that of the three-wavelength semiconductor laser apparatus 100 according to the first embodiment.

A manufacturing process for the three-wavelength semiconductor laser apparatus 200 is similar to the manufacturing process for the three-wavelength semiconductor laser apparatus 100 according to the first embodiment except that the blue-violet semiconductor laser device 210 and the two-wavelength semiconductor laser device 250 are bonded to the heat radiation substrate 40 formed through the manufacturing process similar to that of the first embodiment and the n-side electrode 259 of the two-wavelength semiconductor laser device 250 and the base portion 50 are connected with each other through the metal wire 291.

According to the second embodiment, as hereinabove described, the width of the heat radiation substrate 40 in the direction B can be decreased even if the three-wavelength semiconductor laser apparatus 200 includes the blue-violet semiconductor laser device 210 and the two-wavelength semiconductor laser device 250 having the red semiconductor laser device 220 and the infrared semiconductor laser device 230 monolithically formed, and hence the three-wavelength semiconductor laser apparatus 200 can be downsized.

According to the second embodiment, the ridge portion 225 of the red semiconductor laser device 220 is arranged on the B1 side opposite to the side on which an extraction wiring portion 42b is arranged relative to the centerline 150. Thus, a photosensitive region Q of the red semiconductor laser device 220 can be arranged as far as possible from the extraction wiring portion 42b (first portion 42e), and hence the monitoring function of the PD 60 for the red semiconductor laser device 220 is not lost. The remaining effects of the second embodiment are similar to those of the aforementioned first embodiment.

Third Embodiment

An optical pickup 300 according to a third embodiment of the present invention is now described with reference to FIGS. 1 and 12. The optical pickup 300 is an example of the "optical apparatus" in the present invention.

Figure 12:
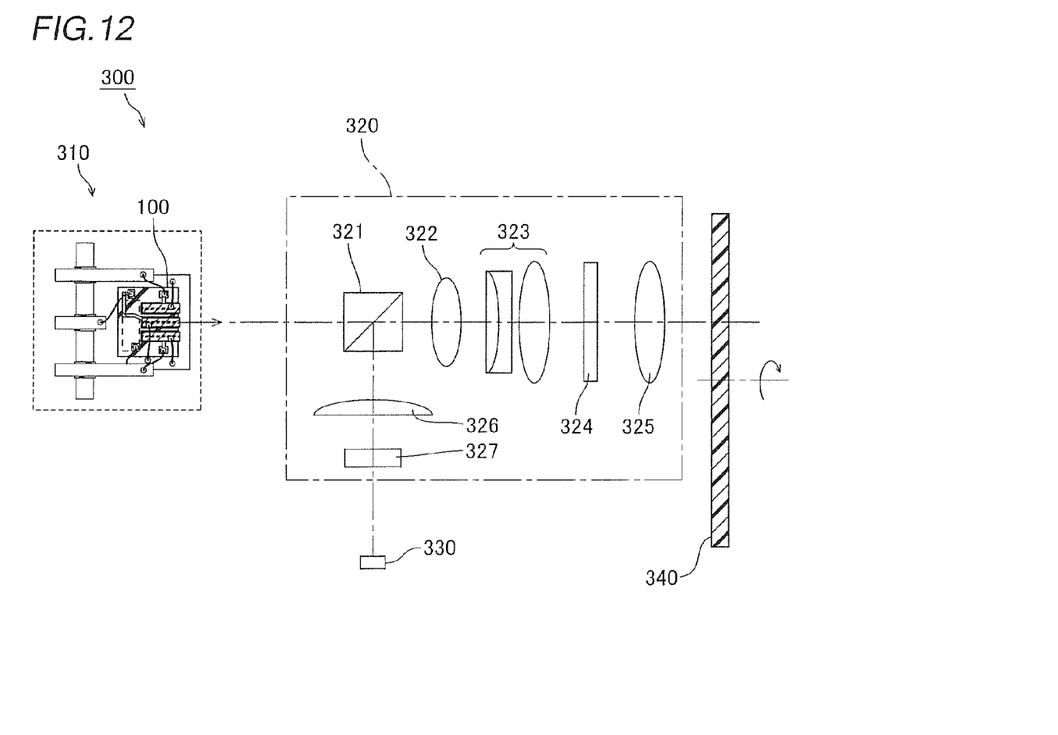
FIG. 12 is a schematic diagram showing the structure of an optical pickup according to a third embodiment of the present invention.

The optical pickup 300 according to the third embodiment of the present invention includes a can-type semiconductor laser apparatus 310 mounted with the three-wavelength semiconductor laser apparatus 100 (see FIG. 1) according to the first embodiment, an optical system 320 adjusting laser beams emitted from the semiconductor laser apparatus 310, and a light detection portion 330 receiving the laser beams, as shown in FIG. 12.

The optical system 320 has a polarizing beam splitter (PBS) 321, a collimator lens 322, a beam expander 323, a λ/4 plate 324, an objective lens 325, a cylindrical lens 326, and an optical axis correction device 327.

The PBS 321 totally transmits the laser beams emitted from the semiconductor laser apparatus 310, and totally reflects the laser beams fed back from an optical disc 340. The collimator lens 322 converts the laser beams emitted from the semiconductor laser apparatus 310 and transmitted through the PBS 321 to parallel beams. The beam expander 323 is constituted by a concave lens, a convex lens, and an actuator (not shown). The actuator has a function of correcting wave surface states of the laser beams emitted from the semiconductor laser apparatus 310 by varying a distance between the concave lens and the convex lens.

The λ/4 plate 324 converts the linearly polarized laser beams, converted to the substantially parallel beams by the collimator lens 322, to circularly polarized beams. Further, the λ/4 plate 324 converts the circularly polarized laser beams fed back from the optical disc 340 to linearly polarized beams. A direction of linear polarization in this case is orthogonal to a direction of linear polarization of the laser beams emitted from the semiconductor laser apparatus 310. Thus, the PBS 321 substantially totally reflects the laser beams fed back from the optical disc 340. The objective lens 325 converges the laser beams transmitted through the λ/4 plate 324 on a surface (recording layer) of the optical disc 340. An objective lens actuator (not shown) renders the objective lens 325 movable.

The cylindrical lens 326, the optical axis correction device 327, and the light detection portion 330 are arranged to be along optical axes of the laser beams totally reflected by the PBS 321. The cylindrical lens 326 provides the incident laser beams with astigmatic action. The optical axis correction device 327 is constituted by a diffraction grating and so arranged that spots of zero-order diffracted beams of blue-violet, red, and infrared laser beams transmitted through the cylindrical lens 326 coincide with each other on a detection region of the light detection portion 330 described later.

The light detection portion 330 outputs a playback signal on the basis of intensity distribution of the received laser beams. Thus, the optical pickup 300 including the semiconductor laser apparatus 310 is formed.

In the optical pickup 300, the semiconductor laser apparatus 310 can independently emit blue-violet, red, and infrared laser beams from the blue-violet semiconductor laser device 10, the red semiconductor laser device 20, and the infrared semiconductor laser device 30 (see FIG. 1). The laser beams emitted from the semiconductor laser apparatus 310 are adjusted by the PBS 321, the collimator lens 322, the beam expander 323, the λ/4 plate 324, the objective lens 325, the cylindrical lens 326, and the optical axis correction device 327 as described above, and thereafter applied onto the detection region of the light detection portion 330.

When data recorded in the optical disc 340 is play backed, the laser beams emitted from the blue-violet semiconductor laser device 10, the red semiconductor laser device 20, and the infrared semiconductor laser device 30 are controlled to have constant power and applied to the recording layer of the optical disc 340, so that the playback signal output from the light detection portion 330 can be obtained. When data is recorded in the optical disc 340, the laser beams emitted from the blue-violet semiconductor laser device 10, the red semiconductor laser device 20, and the infrared semiconductor laser device 30 are controlled in power and applied to the optical disc 340, on the basis of the data to be recorded. Thus, the data can be recorded in the recording layer of the optical disc 340. Thus, the data can be recorded in or played back from the optical disc 340 with the optical pickup 300 including the semiconductor laser apparatus 310.

According to the third embodiment, as hereinabove described, the optical pickup 300 is mounted with the semiconductor laser apparatus 310 including the aforementioned three-wavelength semiconductor laser apparatus 100 according to the first embodiment, and hence the optical pickup 300 having the downsized semiconductor laser apparatus 310 can be obtained. The remaining effects of the third embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the extraction wiring portion 42b has the first portion 42e and the second portion 42f in each of the aforementioned first to third embodiments, the present invention is not restricted to this. In the present invention, without providing the second portion 42f, the first portion 42e may linearly pass across the photosensitive surface 60a in the direction A2 to extract the pad electrode 42 to the rear side (A2 side) of the PD 60. According to this structure of a modification, the photosensitive region Q of the infrared semiconductor laser device 30 can be more reliably prevented from being blocked.

While the second portion 42f is arranged on the photosensitive surface 60a in the vicinity of the A2-side edge portion of the PD 60 in each of the aforementioned first to third embodiments, the present invention is not restricted to this. In the present invention, the second portion 42f may be connected to the wire-bonding portion 42c in a state where the same extends in the direction B2 outside (on the A2 side of) the A2-side edge portion of the PD 60.

While the first portion 42e of the extraction wiring portion 42b is arranged in the position (on the B2 side) deviating to the infrared semiconductor laser device 30, and the second portion 42f further extends in the direction B2 from the end portion of the first portion 42e in each of the aforementioned first to third embodiments, the present invention is not restricted to this. In the present invention, the first portion 42e may be arranged in a position (on the B1 side) deviating to the blue-violet semiconductor laser device 10, and the second portion 42f may further extend in the direction B1. In this case, the direction B1 corresponds to the "first direction" in the present invention, and the direction B2 corresponds to the "fourth direction" in the present invention.

While the three semiconductor laser devices are aligned in the direction B on the heat radiation substrate 40 in each of the aforementioned first to third embodiments, the present invention is not restricted to this. In the present invention, four or more semiconductor laser devices may be aligned in the direction B. In this case, each of a plurality of pad electrodes connected to the inner semiconductor laser devices other than the two outer semiconductor laser devices includes the "extraction wiring portion" in the present invention. The "extraction wiring portion" in the present invention provided on each of the pad electrodes may be formed to have only the "first portion" linearly crossing the PD 60 in the direction A2, or the "first portion" and the "second portion" bended on the photosensitive surface 60a in plan view and extracted to the outside of the PD 60 in the direction B. Alternatively, the pad electrodes each having only the "first portion" and the pad electrodes each having the "first portion" and the "second portion" may be mixed. A wiring pattern of each of the pad electrodes crossing the photosensitive surface 60a can be arbitrarily determined on the basis of the number of semiconductor laser devices arranged on the heat radiation substrate 40, the size of the photosensitive surface 60a of the PD 60, the position of the wire-bonding portion, etc.

When the "second portion" is formed, the number n1 (three, for example) of pad electrodes from a pad electrode adjacent on the B1 side of a pad electrode formed with the "second portion" through a pad electrode on a B1-side end portion and the number n2 (five, for example) of pad electrodes from a pad electrode adjacent on the B2 side of the pad electrode formed with the "second portion" through a pad electrode on a B2-side end portion are compared with each other, and the "extraction wiring portion" is preferably formed to extract the "second portion" to the side (B1 side) having a less number (=n1) of pad electrodes. According to this structure of a modification, the number of semiconductor laser devices, the rear sides of photosensitive regions (photosensitive surface) for which are crossed in the direction B (direction B1) by the "second portion", can be minimized, and hence the number of photosensitive regions blocked by the "second portion" can be prevented from increase. The "second portion" of a pad electrode arranged at a position where n1=n2 can be extracted to the B1 side or the B2 side.

While the insulating film 65 is formed of $SiO_2$ on the upper surface 40a of the heat radiation substrate 40 in each of the aforementioned first to third embodiments, the present invention is not restricted to this. In the present invention, an insulating film for insulating the p-type diffusion region 61 of the PD 60 from the extraction wiring portion 42b may be formed of an insulating material other than $SiO_2$. The photosensitive surface 60a other than a region where the extraction wiring portion 42b is arranged may or may not be covered with the insulating film.

While the pad electrodes 41, 42, and 43 are patterned through a mask pattern in a prescribed shape serving as a mask in each of the manufacturing processes of the aforementioned first and second embodiments, the present invention is not restricted to this. In the present invention, a resist pattern having openings formed in planar shapes of the pad electrodes 41, 42, and 43 may be formed in a prescribed position on the insulating film 65, an electrode layer may be formed on a portion of the insulating film 65 exposed from the openings, and the pad electrodes 41, 42, and 43 may be patterned by lift-off for removing the resist pattern.

While the three-wavelength semiconductor laser apparatus 100 is constituted by the blue-violet semiconductor laser device 10, the red semiconductor laser device 20, and the infrared semiconductor laser device 30 in the aforementioned first embodiment, the present invention is not restricted to this. In the present invention, an RGB three-wavelength semiconductor laser apparatus including a green semiconductor laser device and a blue semiconductor laser device each made of a nitride-based semiconductor and the red semiconductor laser device 20 may be employed as the "semiconductor laser apparatus" in the present invention.

While the blue-violet semiconductor laser device, the red semiconductor laser device, and the infrared semiconductor laser device are arranged in this order from the B1 side to the B2 side on the heat radiation substrate 40 in each of the aforementioned first and second embodiments, the present invention is not restricted to this. In the present invention, the three semiconductor laser devices may be arranged in the different order from that described above. For example, the blue-violet semiconductor laser device may be arranged in the center, and the red semiconductor laser device and the infrared semiconductor laser device may be arranged on both sides of the blue-violet semiconductor laser device. In this case, the semiconductor laser devices may be arranged separately, or the single blue-violet semiconductor laser device and a two-wavelength semiconductor laser device formed integrally with the red semiconductor laser device and the infrared semiconductor laser device may be employed as in the aforementioned second embodiment. When the two-wavelength semiconductor laser device is employed, the width of the groove portion 252 (see FIG. 11) is enlarged in the direction B so that a portion of the n-type GaAs substrate 251 corresponding to the enlarged groove portion can run across above (the C2 side of) the blue-violet semiconductor laser device. In this case, the height (thickness) of the blue-violet semiconductor laser device or the depth of the groove portion of the two-wavelength semiconductor laser device is arbitrarily adjusted, whereby the two-wavelength semiconductor laser device can be put over the blue-violet semiconductor laser device in plan view. Further, the n-side electrode of the blue-violet semiconductor laser device may be connected to the base portion 50 through a dedicated metal wire. Alternatively, an n-side semiconductor layer of the blue-violet semiconductor laser device previously bonded may be simultaneously bonded to the bottom surface of the groove portion (the lower surface of the n-type GaAs substrate 251) through a conductive fusion layer when the two-wavelength semiconductor laser device is bonded to the base. Thus, n-side semiconductor layers of the semiconductor laser devices can be connected to the base portion 50 through a single common metal wire.

While the semiconductor laser devices are bonded to the heat radiation substrate 40 in a junction-down system in each of the aforementioned first to third embodiments, the present invention is not restricted to this. In the present invention, the semiconductor laser devices may be bonded to the heat radiation substrate 40 in a junction-up system. In this case, the light-emitting points of the semiconductor laser devices are located at a position higher (in a direction upwardly away from the photosensitive surface 60a) than that in a junction-down system, and hence the photosensitive regions P, Q, and R shown in FIG. 1 must be enlarged up to a more rearward (A2-side) position. Therefore, the second portion 42f is preferably arranged along the vicinity of the A2-side edge portion of the photosensitive surface 60a as in the extraction wiring portion 42b shown in each of the first and second embodiments. Alternatively, the second portion 42f is more preferably arranged outside (on the A2 side of) the A2-side edge portion of the PD 60.

While the current blocking layers 27 and 37 are formed of $SiO_2$ in each of the aforementioned first to third embodiments, the present invention is not restricted to this. For example, the current blocking layers may be formed of another insulating material such as SiN or a semiconductor material such as AlInP or AlGaN.

While the three-wavelength semiconductor laser apparatus 100 is mounted on the can-type semiconductor laser apparatus 310 in the aforementioned third embodiment, the present invention is not restricted to this. In the present invention, the aforementioned three-wavelength semiconductor laser apparatus 100 according to the first embodiment or the aforementioned three-wavelength semiconductor laser apparatus 200 according to the second embodiment may be mounted on a frame-type package having a plate-like planar structure.

While the optical pickup 300 including the "semiconductor laser apparatus" in the present invention has been shown in the aforementioned third embodiment, the present invention is not restricted to this, but the semiconductor laser apparatus in the present invention may be applied to an optical disc apparatus performing record in an optical disc such as a CD, a DVD, or a BD or playback of the optical disc and an optical apparatus such as a projector.

What is claimed is:

1. A semiconductor laser apparatus comprising:
   a base;
   a plurality of electrodes arranged along a first direction on an upper surface of said base;
   a plurality of semiconductor laser devices bonded to respective upper surfaces of said plurality of electrodes, emitting laser beams in a second direction intersecting with said first direction; and
   a photodetector having a photosensitive surface arranged in a region of said base in a third direction opposite to said second direction relative to said plurality of semiconductor laser devices, wherein
   an electrode arranged in a position other than end portions in said first direction and a fourth direction opposite to said first direction, of said plurality of electrodes includes an extraction wiring portion arranged on said photosensitive surface of said photodetector.

2. The semiconductor laser apparatus according to claim 1, wherein
   said extraction wiring portion is arranged on said photosensitive surface excluding photosensitive regions of said photosensitive surface of said photodetector receiving laser beams emitted in said third direction from said plurality of semiconductor laser devices.

3. The semiconductor laser apparatus according to claim 1, wherein
   said extraction wiring portion is formed on said photosensitive surface of said photodetector through an insulating film.

4. The semiconductor laser apparatus according to claim 1, wherein
   said electrode including said extraction wiring portion further includes a device bonding portion to which a semiconductor laser device corresponding to said electrode, of said plurality of semiconductor laser devices is bonded, and
   said extraction wiring portion has a first portion extending in said third direction on said photosensitive surface of said photodetector, starting from a position of an end portion of said device bonding portion in said third direction, which deviates to a semiconductor laser device adjacent in said first direction from a first centerline of said semiconductor laser device corresponding to said electrode, which extends in said second direction.

5. The semiconductor laser apparatus according to claim 4, wherein
said first portion extends in said third direction on said photosensitive surface of said photodetector, starting from a corner of said device bonding portion in said first direction.

6. The semiconductor laser apparatus according to claim 4, wherein
at least a part of said first portion extends in said third direction on an intermediate line extending along an intermediate position between said first centerline and a second centerline of said semiconductor laser device adjacent in said first direction, which extends in said second direction.

7. The semiconductor laser apparatus according to claim 6, wherein
said first portion has a bending portion extending obliquely in said first direction from said first centerline as said first portion extends in said third direction from said device bonding portion, and
said bending portion is formed to connect said device bonding portion and a portion of said first portion extending in said third direction on said intermediate line with each other.

8. The semiconductor laser apparatus according to claim 4, wherein
said first portion is arranged in a position deviating to said first centerline from an intermediate line between said first centerline and a second centerline of said semiconductor laser device adjacent in said first direction, which extends in said second direction.

9. The semiconductor laser apparatus according to claim 4, wherein
said extraction wiring portion further has a second portion extending along said first direction from an end portion of said first portion in said third direction, and
said second portion extends on said photosensitive surface of said photodetector along said first direction in which said first portion is arranged relative to said first centerline.

10. The semiconductor laser apparatus according to claim 9, wherein
said second portion is arranged on said photosensitive surface in a vicinity of an edge portion of said photodetector in said third direction.

11. The semiconductor laser apparatus according to claim 10, wherein
each of said plurality of semiconductor laser devices includes an active layer, and
at least a semiconductor laser device arranged in a position opposed to said second portion along said second direction, of said plurality of semiconductor laser devices is formed such that a surface thereof closer to said active layer is bonded to an electrode corresponding to said semiconductor laser device, of said plurality of electrodes.

12. The semiconductor laser apparatus according to claim 9, wherein
a width of said first portion in said first direction and a width of said second portion in said second direction are substantially equal to each other.

13. The semiconductor laser apparatus according to claim 1, wherein
a width of said photodetector in said first direction is larger than a width in said first direction of a region where said plurality of electrodes are arranged, and
said photodetector is commonly employed for said plurality of semiconductor laser devices.

14. The semiconductor laser apparatus according to claim 1, wherein
said base is made of a semiconductor material and said photodetector is embedded in said base, and
said photosensitive surface of said photodetector is flush with said upper surface of said base.

15. The semiconductor laser apparatus according to claim 1, wherein
each of said plurality of semiconductor laser devices includes a ridge portion for forming a waveguide extending along said second direction, and
said ridge portion of a semiconductor laser device corresponding to said electrode including said extraction wiring portion, of said plurality of semiconductor laser devices is arranged in said fourth direction opposite to said first direction in which said extraction wiring portion is arranged relative to a first centerline of said semiconductor laser device extending in said second direction.

16. The semiconductor laser apparatus according to claim 1, wherein
said electrode including said extraction wiring portion further includes a first wire-bonding portion provided outside said photosensitive surface of said photodetector from said extraction wiring portion.

17. The semiconductor laser apparatus according to claim 16, wherein
said first wire-bonding portion is arranged on an outside of said photodetector in said first direction.

18. The semiconductor laser apparatus according to claim 16, wherein
said plurality of semiconductor laser devices include a first semiconductor laser device bonded to said electrode including said extraction wiring portion and said first wire-bonding portion, and a second semiconductor laser device and a third semiconductor laser device bonded to respective electrodes arranged in positions of end portions in said first direction and said fourth direction relative to said first semiconductor laser device, of said plurality of electrodes,
said electrode to which said second semiconductor laser device is bonded includes a second wire-bonding portion provided on a side of said second semiconductor laser device opposite to a side on which said first semiconductor laser device is arranged, and
said electrode to which said third semiconductor laser device is bonded includes a third wire-bonding portion provided on a side of said third semiconductor laser device opposite to a side on which said first semiconductor laser device is arranged.

19. The semiconductor laser apparatus according to claim 1, further comprising a pad electrode formed on a region of said photodetector in said fourth direction opposite to said first direction in which said extraction wiring portion is arranged, conducting with said photodetector.

20. An optical apparatus comprising:
a semiconductor laser apparatus including a base, a plurality of electrodes arranged along a first direction on an upper surface of said base, a plurality of semiconductor laser devices bonded to respective upper surfaces of said plurality of electrodes, emitting laser beams in a second direction intersecting with said first direction, and a photodetector having a photosensitive surface arranged in a region of said base in a third direction opposite to said second direction relative to said plurality of semiconductor laser devices; and an optical system controlling laser beams emitted from said semiconductor laser apparatus, wherein an electrode arranged in a position other than end portions in said first direction and a fourth direction opposite to said first direction, of said plurality of electrodes has an extraction wiring portion arranged on said photosensitive surface of said photodetector.

* * * * *